(12) United States Patent
Tolani et al.

(10) Patent No.: US 10,866,197 B2
(45) Date of Patent: Dec. 15, 2020

(54) DISPOSITIONING DEFECTS DETECTED ON EXTREME ULTRAVIOLET PHOTOMASKS

(71) Applicant: KLA Corporation, Milpitas, CA (US)

(72) Inventors: Vikram Tolani, San Jose, CA (US); Masaki Satake, Saitama (JP); Weston L. Sousa, San Jose, CA (US)

(73) Assignee: KLA Corp., Milpitas, CA (US)

( * ) Notice: Subject to any disclaimer, the term of this patent is extended or adjusted under 35 U.S.C. 154(b) by 0 days.

(21) Appl. No.: 16/563,763

(22) Filed: Sep. 6, 2019

(65) Prior Publication Data

US 2020/0096862 A1 Mar. 26, 2020

Related U.S. Application Data

(60) Provisional application No. 62/733,961, filed on Sep. 20, 2018.

(51) Int. Cl.

| G01N 21/95 | (2006.01) |
|---|---|
| G01N 21/956 | (2006.01) |
| G03F 1/86 | (2012.01) |
| G01N 21/33 | (2006.01) |
| G03F 1/22 | (2012.01) |
| G01N 23/2255 | (2018.01) |
| G03F 1/74 | (2012.01) |
| G01N 23/2251 | (2018.01) |

(52) U.S. Cl.
CPC .......... *G01N 21/956* (2013.01); *G01N 21/33* (2013.01); *G01N 23/2251* (2013.01); *G01N 23/2255* (2013.01); *G03F 1/22* (2013.01); *G03F 1/74* (2013.01); *G03F 1/86* (2013.01)

(58) Field of Classification Search
CPC .... G03F 1/22; G03F 1/86; G03F 1/74; G01N 23/2251; G01N 23/2255; G01N 21/33; G01N 21/956; G01N 2021/95676; G01N 2021/335

See application file for complete search history.

(56) References Cited

U.S. PATENT DOCUMENTS 6,002,740 A * 12/1999 Cerrina ............... G01B 15/025
378/35
6,873,720 B2 * 3/2005 Cai ................... G01N 21/95607
382/144

(Continued)

OTHER PUBLICATIONS

International Search Report for PCT/US2019/051805 dated Dec. 30, 2019.

(Continued)

*Primary Examiner* — Naum Levin
(74) *Attorney, Agent, or Firm* — Ann Marie Mewherter

(57) ABSTRACT

Methods and systems for photomask defect dispositioning are provided. One method includes directing energy to a photomask and detecting energy from the photomask. The photomask is configured for use at one or more extreme ultraviolet wavelengths of light. The method also includes detecting defects on the photomask based on the detected energy. In addition, the method includes generating charged particle beam images of the photomask at locations of the detected defects. The method further includes dispositioning the detected defects based on the charged particle beam images generated for the detected defects.

28 Claims, 7 Drawing Sheets

(56) References Cited

U.S. PATENT DOCUMENTS

| | | | |
|---|---|---|---|
| 6,921,905 B2* | 7/2005 | Shishido | G01J 3/10 |
| | | | 250/372 |
| 6,976,240 B2* | 12/2005 | Chang | G03F 1/84 |
| | | | 716/52 |
| 7,093,229 B2* | 8/2006 | Pang | G03F 1/84 |
| | | | 716/52 |
| 7,463,350 B2* | 12/2008 | Nishiyama | G01N 21/95684 |
| | | | 356/237.4 |
| 7,570,796 B2 | 8/2009 | Zafar et al. | |
| 7,676,077 B2 | 3/2010 | Kulkarni et al. | |
| 7,747,062 B2* | 6/2010 | Chen | G01N 21/8851 |
| | | | 382/141 |
| 8,126,255 B2* | 2/2012 | Bhaskar | G06T 1/20 |
| | | | 382/141 |
| 8,213,704 B2* | 7/2012 | Peterson | G03F 1/84 |
| | | | 356/237.4 |
| 8,274,047 B2* | 9/2012 | Naito | G01N 23/203 |
| | | | 250/306 |
| 8,497,476 B2* | 7/2013 | Hatakeyama | G01N 23/2251 |
| | | | 250/310 |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 8,953,869 B2* | 2/2015 | Nasser-Ghodsi | G06T 7/001 |
| | | | 382/141 |
| 9,002,497 B2 | 4/2015 | Marella et al. | |
| 9,478,019 B2 | 10/2016 | Sezginer et al. | |
| 9,494,851 B2* | 11/2016 | Orihara | B82Y 10/00 |
| 9,740,805 B1* | 8/2017 | Bergman | G03F 7/70633 |
| 9,829,787 B2* | 11/2017 | Terasawa | G01B 11/24 |
| 9,892,503 B2* | 2/2018 | Guan | G01N 21/95607 |
| 9,915,625 B2* | 3/2018 | Gao | G06T 7/001 |
| 10,241,390 B2* | 3/2019 | Hanekawa | G03F 1/54 |
| 10,401,299 B2* | 9/2019 | Ogawa | G01N 21/956 |
| 10,451,563 B2* | 10/2019 | Sousa | G06T 7/001 |
| 10,634,623 B2* | 4/2020 | Zhang | G01N 21/95623 |
| 2004/0119036 A1 | 6/2004 | Ye et al. | |
| 2008/0079931 A1 | 4/2008 | Lim et al. | |
| 2011/0299759 A1 | 12/2011 | Shi et al. | |
| 2013/0156939 A1 | 6/2013 | Budach et al. | |
| 2013/0336574 A1 | 12/2013 | Nasser-Ghodsi et al. | |
| 2014/0165236 A1 | 6/2014 | Budach et al. | |
| 2014/0241610 A1 | 8/2014 | Duffy et al. | |
| 2015/0285744 A1* | 10/2015 | Ogawa | G02B 27/286 |
| | | | 348/126 |
| 2016/0377553 A1* | 12/2016 | Terasawa | G01N 21/9501 |
| | | | 430/5 |
| 2017/0053395 A1* | 2/2017 | Guan | G01N 21/95607 |
| 2018/0107928 A1 | 4/2018 | Zhang et al. | |
| 2019/0073568 A1 | 3/2019 | He et al. | |

OTHER PUBLICATIONS

Bonam et al., "EUV Mask and Wafer Defectivity: Strategy and Evaluation for Full Die Defect Inspection," Extreme Ultraviolet (EUV) Lithography VII, Proceedings of SPIE vol. 9776, 97761C, Jun. 2016, 8 pages.

Cho et al., "Classification and printability of EUV mask defects from SEM images," International Conference on Extreme Ultraviolet Lithography 2017, Proceedings of SPIE vol. 10450, 1045006, Oct. 26, 2017, 8 pages.

Choi et al., "EUV Mask inspection using high NA DUV inspection tool," Emerging Lithographic Technologies XII, Proc. of SPIE vol. 6921, 692123, Mar. 21, 2008, 8 pages.

Clifford et al., "Compensation methods using a new model for buried defects in extreme ultraviolet lithography masks," Photomask Technology 2010, Proceedings of SPIE vol. 7823, 78230V, Sep. 24, 2010, 10 pages.

Naka et al., "Capability of Model EBEYE M for EUV Mask Production," Nov. 8, 2012, SPIE Photomask Technology 2012, Proceedings vol. 8522, 14 pages.

Naka et al., "DUV inspection beyond optical resolution limit for EUV mask of hp 1X nm," Photomask Technology 2017, SPIE 10451, 104510K, Oct. 16, 2017, 16 pages.

Satake et al., "Evaluation of lithography simulation model accuracy for hotspot-based mask quality assurance," Photomask and Next-Generation Lithography Mask Technology XIV, Proceedings of SPIE 6607, 66071E, May 14, 2007.

Shimomura et al., "Electron beam inspection of 16nm HP node EUV masks," Photomask Technology 2012, Proc. of SPIE vol. 8522, 85220L, Nov. 8, 2012, 7 pages.

Van den Heuvel et al., "Investigation of the performance of state-of-the-art defect inspection tools within EUV lithography," Metrology, Inspection, and Process Control for Microlithography XXVI, Proceedings of SPIE, vol. 8324, 83240L, Apr. 10, 2012, 13 pages.

Verduijn et al., "Printability and actinic AIMS review of programmed mask blank defects," SPIE Proceedings vol. 10143, Extreme Ultraviolet (EUV) Lithography VIII, 101430K, Mar. 24, 2017, 13 pages.

* cited by examiner

DISPOSITIONING DEFECTS DETECTED ON EXTREME ULTRAVIOLET PHOTOMASKS

BACKGROUND OF THE INVENTION

1. Field of the Invention

This invention generally relates to the field of photomask inspection and defect dispositioning. More particularly, the present invention relates to methods and systems for inspection and review of photomasks designed for use at extreme ultraviolet wavelength(s).

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a photomask to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

With the performance of 193 nm immersion lithography reaching its limit as well as the substantially high cost and yield issues associated with multi-patterning lithography processes, extreme ultraviolet (EUV) lithography has been under extensive development. It is the leading candidate of next generation lithography (NGL) technology to extend Moore's law, driving computer chips to be smaller, faster, and more efficient.

Defectivity control of EUV photomasks, which define the patterns printed on wafers, plays a critical role from a process yield management perspective. However, it has been regarded as one of the high risk areas of EUV lithography development due to the lack of actinic EUV photomask or high throughput charged particle beam inspection tools that can inspect the photomask at the necessary resolution. Currently, and for the foreseeable future, the inspection of patterned EUV photomasks may have to solely rely on the available inspection tools operating within the deep ultraviolet (DUV) wavelength range (e.g., 193 nm to 257 nm).

Such dramatic differences in wavelength between photomask use and photomask inspection have a significant impact on the performance of DUV inspection tools when it comes to EUV photomasks. In contrast, old inspection methods for DUV masks had sufficient defect and pattern resolution at the 193 nm inspection wavelength that no separate review was really needed. Currently, EUV photomask inspection performed with DUV inspection tools aims to generate defects on the order of hundreds of detections so that the subsequent review of these defects is not onerous to either the scanning electron microscopy (SEM) tool or operator reviewing each defect manually. DUV inspection tools also have limited resolution on mask dimensions targeted for EUV patterning. For example, the theoretical resolution limit for DUV mask inspection tools is about 60 nm half-pitch (HP) on 4× masks, which means that main feature sizes on EUV masks will be well beyond the practical resolution of DUV inspection tools.

Nevertheless, inspection tools with various illumination conditions to maximize defect sensitivity and/or main pattern modulation are being explored for initial RN defect detection. Due to the generally low signal-to-noise in DUV inspection imaging of EUV masks, these inspections often result in hundreds or thousands of defects getting detected. And if one would like to extend the detection capability even further, then there may be hundreds of thousands of detections on each DUV inspection. Each one of these detections then needs to be accurately reviewed and dispositioned. Visually reviewing each defect is difficult due to poor DIN resolution and the risk of manual defect misclassification goes up with defect counts. In addition, the lack of a reliable aerial image dispositioning system makes it even more challenging to disposition EUV mask defects for printability.

Accordingly, it would be advantageous to develop methods and/or systems for photomask defect dispositioning that do not have one or more of the disadvantages described above.

SUMMARY OF THE INVENTION

The following description of various embodiments is not to be construed in any way as limiting the subject matter of the appended claims.

One embodiment relates to a photomask inspection system that includes an inspection subsystem configured for directing energy to a photomask and detecting energy from the photomask. The photomask is configured for use at one or more extreme ultraviolet (EUV) wavelengths of light. The system also includes one or more computer subsystems configured for detecting defects on the photomask based on the detected energy. In addition, the system includes a charged particle beam subsystem configured for generating charged particle beam images of the photomask at locations of the detected defects determined by the one or more computer subsystems. The one or more computer subsystems are configured for dispositioning the detected defects based on the charged particle beam images generated for the detected defects. The photomask inspection system may be further configured as described herein.

Another embodiment relates to a method for inspecting a photomask. The method includes directing energy to a photomask and detecting energy from the photomask. The photomask is configured for use at one or more EUV wavelengths of light. The method also includes detecting defects on the photomask based on the detected energy. In addition, the method includes generating charged particle beam images of the photomask at locations of the detected defects. The method further includes dispositioning the detected defects based on the charged particle beam images generated for the detected defects.

The method described above may be performed as described further herein. In addition, the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for inspecting a photomask. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
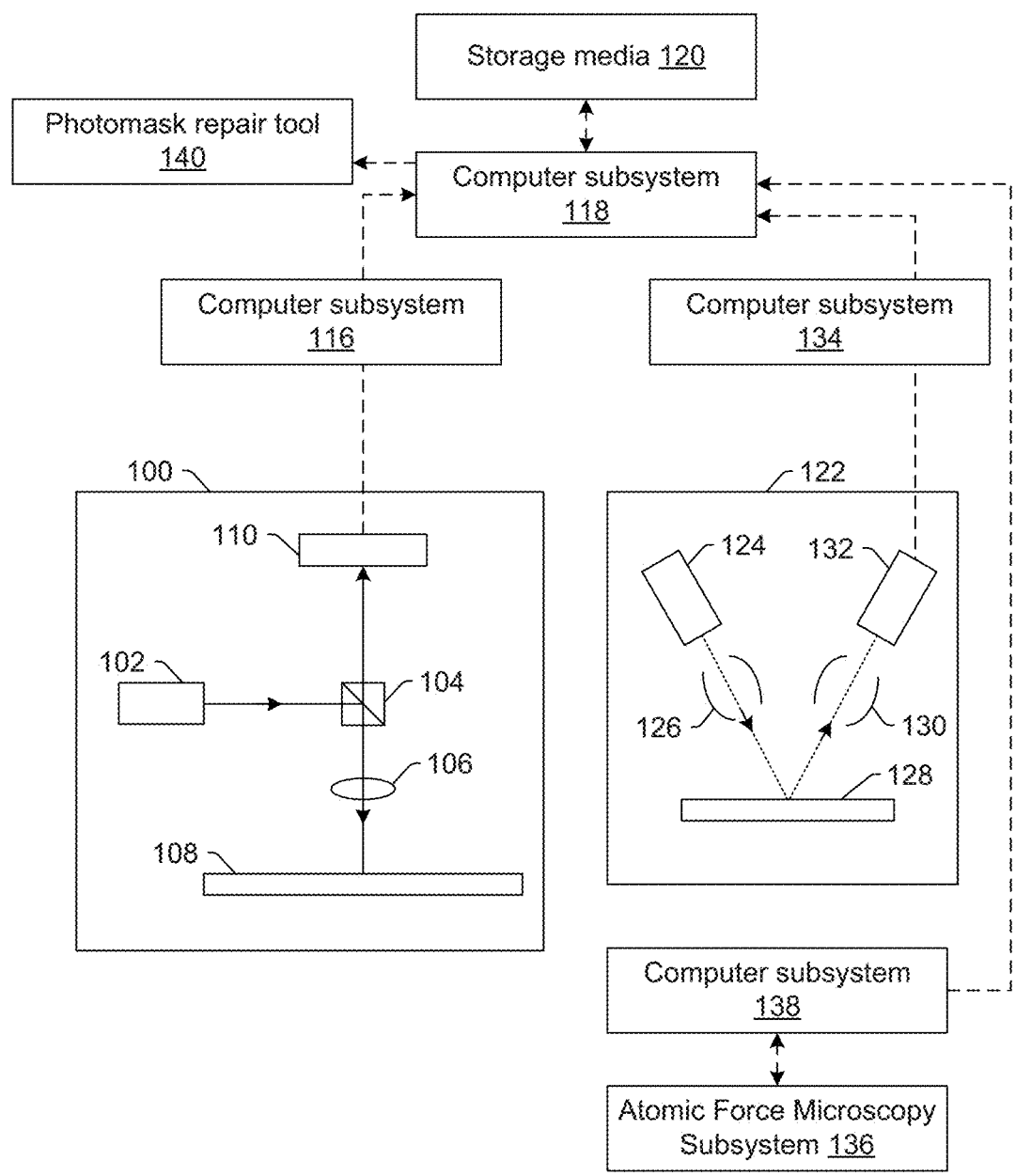
FIG. 1 is a schematic diagram illustrating a side view of one embodiment of a photomask inspection and defect dispositioning system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" used herein refers to information and data that is generated by semiconductor device designers in a design process and is therefore available for use in the embodiments described herein well in advance of printing of the design on any physical substrates. Therefore, the terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA, Milpitas, Calif. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell data, integrated layout data, design data for one or more layers, derivatives of the design data, and full or partial chip design data.

The "design" or "physical design" may also be the design as it would be ideally formed on the photomask. In this manner, a design as described herein may include all of the features of the design that would be printed on the photomask including any optical proximity correction (OPC) features, which are added to the design to enhance printing of the features on the wafer without actually being printed themselves.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to extreme ultraviolet (EUV) photomask defect inspection using a hot inspection (e.g., a deep ultraviolet (DUV), e.g., 193 nm, optical inspection) followed by substantially fast defect disposition using secondary charged particle beam images. EUV lithography is the leading technology for next-generation lithography (NGL), whose viability relies on the availability of a properly functional EUV photomask inspection tool, which can capture all of the critical yield-impacting defects. The use of existing photomask inspection tools can be extended to EUV photomask inspection by running them "hot" in order to achieve the required defect sensitivity, despite the substantially high number of defects that will be detected in the inspection, and then dispositioning each detected defect (or at least a substantial portion of the detected defects) using charged particle beam imaging (such as scanning electron microscopy (SEM)), and possibly atomic force microscopy (AFM), based classification and printability modeling. As described further herein, the embodiments may be configured to use charged particle beam images and optionally AFM images to disposition the detected defects. In addition, some embodiments described herein are configured for automated algorithm and work flow of charged particle beam imaging/analysis and optionally AFM analysis including defect isolation, classification, and printability analysis.

One embodiment relates to a photomask inspection system. One embodiment of such a system is shown in FIG. 1. The photomask inspection system includes an inspection subsystem configured for directing energy to a photomask and detecting energy from the photomask. In one embodiment, the energy directed to the photomask by the inspection subsystem includes one or more DUV wavelengths of light. The photomask is configured for use at one or more EUV wavelengths of light. In other words, the photomask is configured to be used in a lithography process that uses one or more EUV wavelengths of light to transfer the pattern from the photomask to a wafer (e.g., by reflecting the RN light off the photomask to the wafer). In this manner, the actinic wavelength of the photomask (i.e., the wavelength of light that is used to transfer a pattern from the photomask to a wafer thereby causing a photochemical reaction in one or more materials on the wafer, e.g., a photoresist) may be different in the embodiments described herein from the wavelength(s) of light used for inspection of the photomask by the embodiments described herein.

In one embodiment, the energy directed to the photomask by the inspection subsystem includes light having a wavelength of 193 nm. In another embodiment, the energy directed to the photomask by the inspection subsystem includes light having one or more wavelengths in a range from 193 nm to 257 nm. In an additional embodiment, the energy directed to the photomask by the inspection subsystem includes light having a wavelength of 13.5 nm (or another EUV wavelength of light).

As shown in FIG. 1, the photomask inspection system includes inspection subsystem 100. Although the photomask inspection system is shown in FIG. 1 as including one inspection subsystem, it is to be understood that the photomask inspection system may include only one inspection subsystem or more than one inspection subsystem such as inspection subsystem 100 shown in FIG. 1 and inspection subsystem 200 shown in FIG. 2 and described further herein.

As further shown in FIG. 1, inspection subsystem 100 includes light source 102. Light source 102 may include any suitable light source known in the art such as a laser. Light source 102 is configured to direct light to beam splitter 104, which is configured to reflect the light from light source 102 to refractive optical element 106. Refractive optical element 106 is configured to focus light from beam splitter 104 to photomask 108. Beam splitter 104 may include any suitable beam splitter such as a 50/50 beam splitter. Refractive optical element 106 may include any suitable refractive optical element, and although refractive optical element 106 is shown in FIG. 1 as a single refractive optical element, it may be replaced with one or more refractive optical elements and/or one or more reflective optical elements.

Light source 102, beam splitter 104, and refractive optical element 106 may, therefore, form an illumination channel for the inspection subsystem. The illumination channel may include any other suitable elements (not shown in FIG. 1) such as one or more polarizing components, diffractive optical elements (DOEs), and one or more filters such as spectral filters. As shown in FIG. 1, the light source, beam splitter, and refractive optical element are configured such that the light is directed to the photomask at a normal or substantially normal angle of incidence. The inspection subsystem may be configured to scan the light over the photomask in any suitable manner.

Light reflected from photomask 108 due to illumination may be collected by refractive optical element 106 and directed through beam splitter 104 to detector 110. Therefore, the refractive optical element, beam splitter, and detector may form a detection channel of the inspection subsystem. The detector may include any suitable imaging detector known in the art such as a charge coupled device (CCD) or time-delayed integrator (TDI). This detection channel may also include one or more additional components (not shown in FIG. 1) such as one or more polarizing components, one or more spatial filters, one or more spectral filters, and the like. Detector 110 is configured to generate output that is responsive to the reflected light detected by the detector. The output may include signals, signal data, images, image data, and any other suitable output.

The inspection subsystem may be configured to have more than one mode in any suitable manner. In some instances, the inspection subsystem can have more than one mode sequentially (e.g., by changing one or more parameters of an imaging lens of the inspection subsystem such as numerical aperture (NA) between scans of a photomask).

Furthermore, the inspection subsystem can scan the photomask with some modes simultaneously and other modes sequentially. The photomask inspection system may be configured to control the optical mode(s) used for any scan of any photomask in any suitable manner.

The photomask inspection system may include a number of other components that are not shown in FIG. 1. For example, the system may include a load module, an alignment module, a handler such as a robotic transfer arm, and an environmental control module and may include any such components known in the art.

The photomask inspection system also includes one or more computer subsystems configured for detecting defects on the photomask based on the detected energy. The computer subsystem(s) may be configured to detect the defects in one or more different ways. For example, the computer subsystem(s) may be configured to compare the output generated by the detector of the inspection subsystem that is responsive to the detected energy (e.g., images, image data, etc.) to corresponding design information for the photomask (e.g., GDS or other design data that may be stored in a design database). Such defect detection is therefore commonly referred to as die-to-database type inspection. Results of the comparison may be compared to one or more thresholds. Output that is above the threshold(s) may be identified as corresponding to defects or potential defects, and output that is not above the threshold(s) may not be identified as corresponding to defects or potential defects. In another example, the output generated by the detector of the inspection subsystem that is responsive to the detected energy and that is generated at the same location in different dies on the photomask may be compared to each other by the computer subsystem(s). Such defect detection is therefore commonly referred to as die-to-die type inspection. Results of such comparisons may be used as described above to identify defects on the photomask.

In one embodiment, the computer subsystem(s) are configured for detecting the defects using a hot threshold. For example, the threshold(s) used in the above described defect detection may be "hot" threshold(s). A "hot" threshold is generally defined as a threshold that is at, within, or substantially near the noise floor of the output generated by the inspection subsystem for the photomask. In this manner, the defect detection can be quite a bit more aggressive (hotter) than would normally be performed for a tuned inspection recipe, so that more events, including defects and nuisance events, are detected than desired in a tuned inspection. In this manner, such an inspection would not normally be useful for production monitoring due to the substantially high nuisance defect detection. Inspection performed with such a threshold is commonly referred to as a "hot" inspection, and the scanning of the photomask performed during such an inspection may be commonly referred to as a "hot" scan.

In one embodiment, as shown in FIG. 1, the photomask inspection system includes computer subsystem 116 coupled to inspection subsystem 100. For example, the computer subsystem may be coupled to a detector, e.g., detector 110, of the inspection subsystem (e.g., by one or more transmission media shown by the dashed line in FIG. 1, which may include any suitable transmission media known in the art). The computer subsystem may be coupled to the detector in any suitable manner such that output (e.g., images) and any other information for the photomask generated by the inspection subsystem can be sent to the computer subsystem and, optionally, such that the computer subsystem can send instructions to the inspection subsystem to perform one or more steps.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, the different computer subsystems may be coupled to each other such that images, data, information, instructions, etc. can be sent between the computer subsystems as described further herein. For example, computer subsystem 110 may be coupled to computer subsystem 118 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

The photomask inspection system also includes a charged particle beam subsystem configured for generating charged particle beam images of the photomask at locations of the detected defects determined by the one or more computer subsystems. In one embodiment, the charged particle beam subsystem is configured as an electron beam subsystem. For example, as shown in FIG. 1, the electron beam subsystem may include electron column 122, which is coupled to computer subsystem 134.

The electron column includes electron beam source 124 configured to generate electrons that are focused to photomask 128 by one or more elements 126. The electron beam source may include, for example, a cathode source or emitter tip, and one or more elements 126 may include, for example, a gun lens, an anode, a beam limiting aperture, a gate valve, a beam current selection aperture, an objective lens, and a scanning subsystem, all of which may include any such suitable elements known in the art.

Electrons returned from the photomask (e.g., secondary electrons) may be focused by one or more elements 130 to detector 132. One or more elements 130 may include, for example, a scanning subsystem, which may be the same scanning subsystem included in element(s) 126.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1 as being configured such that the electrons are directed to the photomask at an oblique angle of incidence and are scattered from the photomask at another oblique angle, it is to be understood that the electron beam may be directed to and scattered from the photomask at any suitable angles. In addition, the electron beam subsystem may be configured to use multiple modes to generate images of the photomask (e.g., with different illumination angles, collection angles, etc.).

The multiple modes of the electron beam subsystem may be different in any image generation parameter(s) of the subsystem.

In another embodiment, the charged particle beam subsystem is configured as an ion beam subsystem. For example, in the electron column shown in FIG. 1, the electron beam source may be replaced with another charged particle beam source such as an ion beam source, which may include any suitable ion beam source known in the art. In addition, the charged particle beam subsystem may have any other suitable ion beam tool configuration such as those included in commercially available focused ion beam (FIB) systems, helium ion microscopy (HIM) systems, and secondary ion mass spectroscopy (SIMS) systems.

Computer subsystem 134 may be coupled to detector 132 as described above. The detector may detect charged particles returned from the surface of the photomask thereby forming charged particle beam images of the photomask. The charged particle beam images may include any suitable charged particle beam images. Computer subsystem 134 may be configured to perform any of the functions described herein using the output of the detector and/or the charged particle beam images. Computer subsystem 134 may be configured to perform any additional step(s) described herein. Computer subsystem 134 may also be further configured as described herein.

Although, in the description of some of the embodiments provided herein, the charged particle beam subsystem may be referred to as a scanning electron microscope (SEM) and the charged particle beam images may be referred to as "SEM images," none of the embodiments described herein are limited to a SEM or SEM images. For example, the charged particle beam subsystem may have any suitable configuration for generating the charged particle beam images including SEMs and other types of electron beam tools, e.g., transmission electron microscopes (TEMs). In addition, the charged particle beam subsystem included in the system may include a commercially available electron beam tool such as the Mask DR-SEM E5600 Series and Mask MVM-SEM® E3600 Series of tools that are commercially available from Advantest America, Inc., San Jose, Calif.

The computer subsystem(s) included in the system may also include a computer subsystem such as computer subsystem 118 that is not coupled to the inspection or charged particle beam subsystem. In this manner, one of the computer subsystems may be a stand alone type computer subsystem, which may be coupled to the other computer subsystems shown in FIG. 1. For example, a stand alone type computer subsystem may be configured to acquire the images described herein and to perform other steps described herein. In one such example, computer subsystems 116 and 134 may be configured to store images received from their respectively coupled inspection and charged particle beam subsystems and to store the images in storage media 120, which may be further configured as described herein. The stand alone type computer subsystem may then acquire the images from the storage media and perform one or more steps described herein using some combination of the images.

As noted above, the photomask inspection system may include more than one inspection subsystem. The inspection subsystem shown in FIG. 2 may also be used in combination with or instead of the inspection subsystem shown in FIG. 1 in the embodiments described herein.

Figure 2:
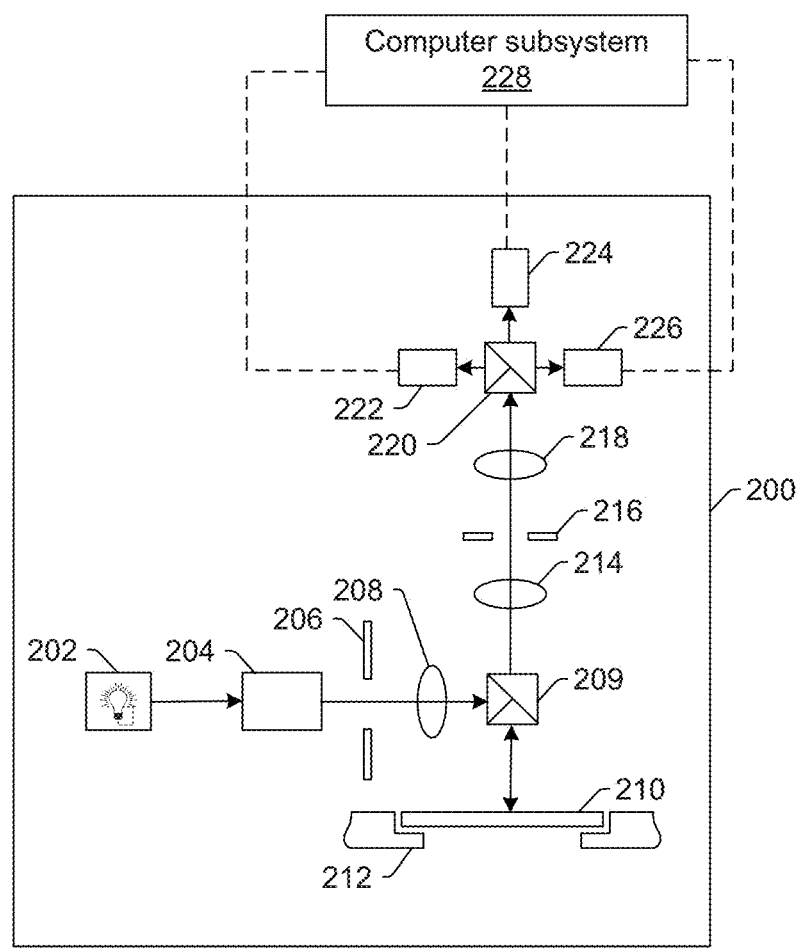
FIG. 2 is a schematic diagram illustrating a side view of one embodiment of an optical subsystem that may be included in embodiments of a photomask inspection system.

As shown in FIG. 2, inspection subsystem 200 includes an illumination subsystem and a collection subsystem as described in more detail herein. The illumination subsystem includes light source 202. Light source 202 may be a coherent light source such as a laser. The light source may be configured to emit monochromatic light having a wavelength of 248 nm, 193 nm, and/or another DUV or EUV wavelength described herein. Alternatively, the light source may be configured to emit light have a range of wavelengths and may be coupled to a spectral filter (not shown). An example of a broadband light source includes, but is not limited to, a He—Xe arc lamp that generates light in the DUV wavelength regime. In this manner, the light source and the filter may emit monochromatic light having a wavelength as described above. The light source may be configured to emit light continuously or at various time intervals in pulses.

The illumination subsystem may also include a number of optical components coupled to the light source. For example, light from light source 202 may first pass through homogenizer 204. Homogenizer 204 may be configured to reduce speckle of the light from the light source. The illumination subsystem may also include aperture 206. Aperture 206 may have an adjustable NA. For example, the aperture may be coupled to a control mechanism that may be configured to mechanically alter the aperture depending upon a control signal received from a user or from program instructions received from a program recipe being run on the system. In this manner, the light may have various partial coherence factors, $\sigma$. For example, aperture 206 may be altered to adjust a pupil of condenser lens 208. The pupil of the condenser lens controls the NA of the system. As the pupil of the condenser is reduced, coherence of the illumination increases thereby decreasing the value of $\sigma$. The value of $\sigma$ may be expressed as the ratio of the NA of the condenser lens to the NA of the objective lens. Exposure systems may have a value of $\sigma$ in a range between about 0.3 to about 0.9. Therefore, aperture 206 may be altered such that the inspection subsystem has a value of $\sigma$ between about 0.3 and about 0.9. The value of $\sigma$ may be altered depending upon the features on the photomask. For example, a higher value for $\sigma$ may be used if the photomask includes lines and spaces than if the photomask includes contact holes. The control mechanism may also be configured to alter the aperture to provide annular or off-axis illumination. The aperture may also be configured to provide other types of illumination such as quadrupole or dipolar illumination. The aperture may be further configured to alter a shape of the beam of light. For example, the aperture may be a diffraction optical element or an apodization aperture.

The illumination subsystem may also include a number of additional optical components (not shown). For example, the illumination subsystem may also include a telescope configured to alter the beam diameter of the light. In addition, the illumination subsystem may include one or more relay lenses, additional lenses such as a field lens, folding mirrors, additional apertures, and beamsplitters.

The illumination subsystem may also include condenser lens 208. Condenser lens 208 may be configured to alter a diameter of the light in the object (photomask) plane to approximately, or greater than, the field of view of the subsystem. Light exiting the condenser lens may be directed to beam splitter 209 that directs light from the condenser lens to photomask 210 to thereby illuminate photomask 210 supported upon stage 212. Beam splitter 209 may include any suitable beam splitter known in the art. The stage is configured to support the photomask by contacting the photomask proximate outer lateral edges of the photomask. Stage 212 may be configured to move the photomask such that an alignment of the photomask may be altered and such that light may scan across the photomask. Alternatively, the illumination system may include a scanning element (not shown) such as an acousto-optical deflector or a mechanical scanning assembly such that the photomask may remain substantially stationary while the light is scanned across the photomask. Stage 212 may also be configured to move the photomask through focus thereby altering a focus setting of the inspection subsystem. The stage may also be coupled to an autofocusing device (not shown) that is configured to alter a position of the stage thereby altering a position of the photomask to maintain a focus setting of the inspection subsystem during an inspection. Alternatively, an autofocusing device may be coupled to the objective lens to alter a position of the objective lens to maintain the focus setting during an inspection.

The inspection subsystem may also include a number of optical components arranged to form a collection subsystem. For example, the collection subsystem includes objective lens 214. Light reflected by the photomask is collected by objective lens 214. The collection subsystem also includes aperture 216 having an adjustable NA. The NA of aperture 216 may also be selected such that light exiting the aperture has a selected magnification. Aperture 216 is positioned between objective lens 214 and lens 218, which may be configured as a tube lens. Light from lens 218 may be directed to beamsplitter 220. Beamsplitter 220 may be configured to direct the light to three detectors 222, 224, and 226. The collection subsystem may also include a number of additional optical components (not shown) such as a magnification lens. The magnification lens may be positioned between lens 218 and beamsplitter 220.

Detectors 222, 224, and 226 may be configured to form an image of the light reflected by an illuminated portion of the photomask. Such an image may be referred to as an "aerial image." The detectors may include, for example, CCDs or TDI cameras. The detectors may also have a one-dimensional or two-dimensional array of pixels. Each of the three detectors may have a different focus setting. In this manner, the three detectors may form images of the photomask at three different focus settings substantially simultaneously. For example, one detector may be substantially in focus, and the other two detectors may be out of focus in opposite directions with respect to the in-focus condition. In addition, the inspection subsystem may include any number of such detectors depending on the mechanical or physical constraints of the inspection subsystem.

Alternatively, the inspection subsystem may only include one detector configured to form an image of the photomask. The detector may have a focus setting approximately equal to a focus setting of an exposure system. Images of the photomask at different focus settings may be formed by altering the focus setting of the detector after each image is formed. In such an embodiment, beamsplitter 220 would not be necessary to split the light to multiple detectors.

Computer subsystem 228 may be coupled to inspection subsystem 200. For example, the computer subsystem may be coupled to a detector, e.g., detectors 222, 224, and 226, of the inspection subsystem (e.g., by one or more transmission media shown by the dashed lines in FIG. 2, which may include any suitable transmission media known in the art). The computer subsystem may be coupled to the detectors in any suitable manner. The computer subsystem may be coupled to the inspection subsystem in any other suitable manner such that image(s) and any other information for the photomask generated by the inspection subsystem can be sent to the computer subsystem and, optionally, such that the computer subsystem can send instructions to the inspection subsystem to perform one or more steps described herein.

It is noted that FIGS. 1 and 2 are provided herein to generally illustrate some configurations of inspection and charged particle beam subsystems that may be included in the embodiments described herein. Obviously, the configurations of the inspection and charged particle beam subsystems described herein may be altered to optimize the performance of the system as is normally performed when designing a commercial inspection system. In addition, the photomask inspection systems described herein may be implemented using existing inspection and charged particle beam subsystems (e.g., by adding functionality described herein to an existing inspection and/or charged particle beam inspection system) such as the photomask inspection tools that are commercially available from KLA. For some such systems, the embodiments described herein may be provided as optional functionality of the system (e.g., in addition to other functionality of the system). Alternatively, the photomask inspection systems described herein may be designed "from scratch" to provide a completely new system.

As described above, the inspection subsystem may be configured as an optical inspection subsystem that is configured to scan the photomask with light having one or more wavelengths. However, the inspection subsystem can be a different type of inspection subsystem. For example, in one embodiment, the energy directed to the photomask by the inspection subsystem includes electrons. In another embodiment, the energy directed to the photomask by the inspection subsystem includes ions. In such embodiments, the inspection subsystem may be configured in a similar manner as shown by electron column 122 in FIG. 1 (possibly with the electron source replaced by an ion beam source). In this manner, the optical inspection subsystem shown in FIG. 1 may be replaced with an electron beam or ion beam inspection subsystem, and the system may include two charged particle beam subsystems (one for inspection and the other for generating the charged particle beam images for the detected defects).

The two charged particle beam subsystems may be different in one or more parameters such that one of the subsystems is particularly suited for inspection while the other is particularly suited for generating the charged particle beam images. For example, the two subsystems may be different in resolution capability (such that the subsystem used for inspection has a lower resolution capability than the one used for charged particle beam imaging). In another alternative, the system may include one charged particle beam subsystem that is used for both inspection and charged particle beam imaging, and one or more parameters of the subsystem can be altered between inspection and imaging such that the subsystem can be used for both tasks. For example, the charged particle beam subsystem shown in FIG. 1 may be configured to have a higher resolution if it is to be used for imaging rather than for inspection. In other words, the embodiments of the charged particle beam subsystem shown in FIG. 1 describe some general and various configurations for charged particle beam subsystems that can be tailored in a number of manners that will be obvious to one skilled in the art to produce subsystems having different imaging capabilities that are more or less suitable for different applications. Electron beam inspection of the photomask may also be performed as described in "Capability of Model EBEYE M for EUV Mask Production" by Naka et al., Nov. 8, 2012, SPIE Photomask Technology 2012, Proceedings Volume 8522, 14 pages, which is incorporated by reference as if fully set forth herein. The embodiments described herein may be further configured as described in this reference.

Figure 3:
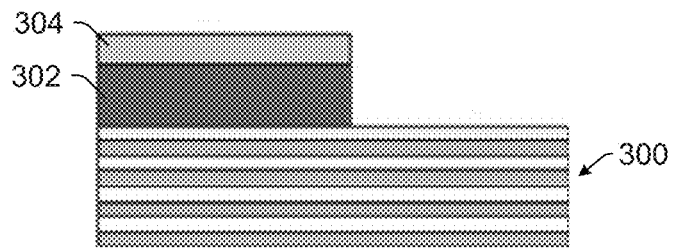
FIG. 3 is a schematic diagram illustrating a side view of one example of a portion of an extreme ultraviolet (RN) photomask.

A typical EUV photomask stack is illustrated in FIG. 3. The mask substrate (not shown) is covered with 40 pairs of molybdenum (Mo)/silicon (Si) multilayer (ML) thin films capped with a relatively thin layer of ruthenium (Ru), shown collectively as thin films 300 in FIG. 3. A bilayer film of tantalum boron nitride (TaBN) 302 and tantalum boron oxide (TaBO) 304 acts as the absorber, which is selectively etched to form the mask pattern. EUV mask inspection can be done by a DUV inspection tool to capture defect sites. Due to the relatively low signal-to-noise ratios (S/N or SNR) that RN mask defects produce in DUV inspection tools, the number of defect sites can be thousands and hundreds of thousands when the DUV inspection tools are used in a relatively high sensitivity mode.

The computer subsystem(s) are configured for dispositioning the detected defects based on the charged particle beam images generated for the detected defects. "Dispositioning" as that term is used herein is defined as determining additional information for a detected defect that can be used to make a final decision for how to appropriately deal with the detected defect, e.g., that a detected defect should be repaired, that a detected defect is a nuisance and can be ignored, that a detected defect does not need to be repaired but the wafers printed with the photomask should be monitored for the detected defect's impact on the wafer patterns formed with the photomask, etc. For example, secondary charged particle beam (e-beam or ion) imaging of the mask described herein provides higher resolution than inspection with relatively high acceleration voltage allowing for much better review of detected defects on masks. Therefore, the charged particle beam images can be used to determine information for the detected defects more accurately (with greater resolution) than the inspection images of the detected defects thereby enabling additional information to be determined from the charged particle beam images that can be used to make decisions about (disposition) the detected defects more effectively. Recent advances in multi-beam and multi-column electron beam imaging also allows for massive SEM data collection. In this manner, after the inspection is completed, test SEM images can be captured on a mask review, CD-SEM, or electron beam inspection tool (or ion beam images can be captured using one of the ion beam tools described herein) at each detected defect location (or a selected subset of the detected defect locations) determined from the previous step of inspection output. Each test charged particle beam image may then be dispositioned from one or more of the following aspects described further herein—detect isolation, classification, and printability.

In one embodiment, the one or more computer subsystems are configured for detecting the defects using a hot threshold, which may be performed as described further herein. In this manner, the embodiments described herein can provide a substantially high sensitivity EUV photomask defect inspection using a hot inspection run followed by subsequent classification and wafer printability simulation of the substantially large number of detected defects using secondary charged particle beam images. Since the charged particle beam images provide higher resolution of the detected defects than the inspection, the charged particle beam images provide more accurate information for the detected defects (e.g., more accurate locations, more accurate dimensions and other characteristics such as texture, shape, etc.) than the inspection images or signals.

In another embodiment, dispositioning the detected defects includes determining if the detected defects are real defects or false defects. For example, each charged particle beam image may be reviewed to assess if the detected defect is real. Determining if the detected defects are real may include determining one or more characteristics of the detected defects and comparing the one or more characteristics to predetermined criteria that separates real defects from false defects. For example, the charged particle beam image of a detected defect may be processed by the computer subsystem(s) to determine dimensions of the detected defect. The determined dimensions may then be compared by the computer subsystem(s) to a threshold that separates real defects from false defects based on size. Other characteristic(s) of the detected defects determined from the charged particle beam images can be used in a similar manner to separate the real defects from false defects.

Since the computer subsystem(s) may be configured for detecting defects on the photomask by applying a hot threshold to the output of the inspection subsystem, a majority of the detected defects may include "false" or "nuisance" defects. "False defects" as that term is used herein is generally defined as defects that are detected on the photomask as such but are not really actual defects on the photomask. Instead, "false defects" may be detected due to non-defect noise sources on the photomask (e.g., line edge roughness (LER), relatively small critical dimension (CD) variation in patterned features, thickness variations, etc.) and/or due to marginalities in the inspection subsystem itself or its configuration used for inspection.

Generally, therefore, the goal of mask inspection is not to detect false defects on photomasks. However, in the embodiments described herein, the computer subsystem(s) may run a hot scan (i.e., a scan in which output is generated for the photomask as energy is scanned across it and a hot threshold is applied to the output to detect defects thereby rendering it a "hot scan") to ensure that all real defects (even those with relatively tow SNR) are captured by inspection. In other words, because it is a hot scan, a significant number of false defects will be detected and at least some real defects or defects of interest (DOIs) will also be detected (because they will also be detected by a hot scan). Regardless of the number of real and false defects that are detected by inspection, the real defects can be separated from the false defects using the charged particle beam images. Unlike the false defects then, "real" defects as that term is used herein can be generally defined as defects that are detected by inspection and confirmed as actual defects and/or DOIs by charged particle beam image processing. What ultimately qualifies as a real defect or a false defect therefore may be controlled by the quality specifications set by the photomask user.

In some embodiments, dispositioning the detected defects includes determining if the detected defects are real defects or false defects, which may be performed as described further herein, and determining a printability of the real defects on a wafer if the wafer is printed with the photomask in a lithography process. In other words, determining the printability simulates the wafer printing (lithography) process that would be performed using the photomask thereby predicting how the real defects would affect the patterns printed on the wafer. For example, each charged particle beam image generated for a detected defect may be reviewed to assess if the detected defect is real, and if real, whether it would be critical and cause relatively large errors at wafer print or nuisance and barely observable errors at wafer print. Instead of performing this manually and using human judgment, an automated and substantially accurate way of modeling the EUV lithographic process is provided by the embodiments described herein thereby enabling substantially accurate prediction of the printability of mask absorber defects starting with the detected defect charged particle beam images.

In one such embodiment, determining the printability includes inputting the charged particle beam images generated for the real defects into a model of the lithography process thereby generating simulated wafer images illustrating how the real defects affect one or more patterns printed on the wafer in the lithography process. Determining the printability predicts the defect printing impact by wafer exposure condition simulation. This simulation may include mask near-field simulation, which can use either Kirchoff approximation, rigorous finite difference time domain (FDTD) solver, rigorous coupled wave analysis (RCWA), or a compact approximation model such as a Defect Printability Simulator (DPS) mask model (examples of which are described in "Compensation methods using a new model for buried defects in extreme ultraviolet lithography masks," by Clifford et al., Photomask Technology 2010, Proceedings of SPIE Vol. 7823, 78230V, Sep. 24, 2010, 10 pages, which is incorporated by reference as if fully set forth herein), optics, and resist exposure and development models, which may include any suitable such models known in the art. If the wafer process is not fixed yet or a mask near field model is not well-determined, the printability can be checked on mask binary layout directly without wafer exposure condition simulation for rough estimation. The embodiments described herein may be configured as described in the above-referenced paper. Determining the printability may also be performed as described in U.S. Pat. No. 9,002,497 issued Apr. 7, 2015 to Marella et al. and U.S. Pat. No. 9,478,019 issued Oct. 25, 2016 to Sezginer et al., which are incorporated by reference as if fully set forth herein.

In another embodiment, dispositioning the detected defects includes determining a printability of the detected defects on a wafer if the wafer is printed with the photomask in a lithography process, and determining the printability includes inputting design information for the photomask into a model of the charged particle beam subsystem thereby generating simulated charged particle beam reference images of a defect free version of the photomask, simulating aerial images for the charged particle beam images generated for the detected defects and for the simulated charged particle beam reference images, and determining how the detected defects affect one or more patterns printed on the wafer in the lithography process based on the simulated aerial images.

In the above embodiment, the defect-free mask may be rendered from the post-OPC design database clips corresponding to the positions of the detected defects in a die-to-database type approach. The charged particle beam-based disposition workflow then involves three main phases as shown in FIG. 6.

In the first phase, the original images from the charged particle beam tool (the images of the photomask generated during the charged particle beam imaging) may be first de-noised and refined to improve the quality of the images.

Figure 6:
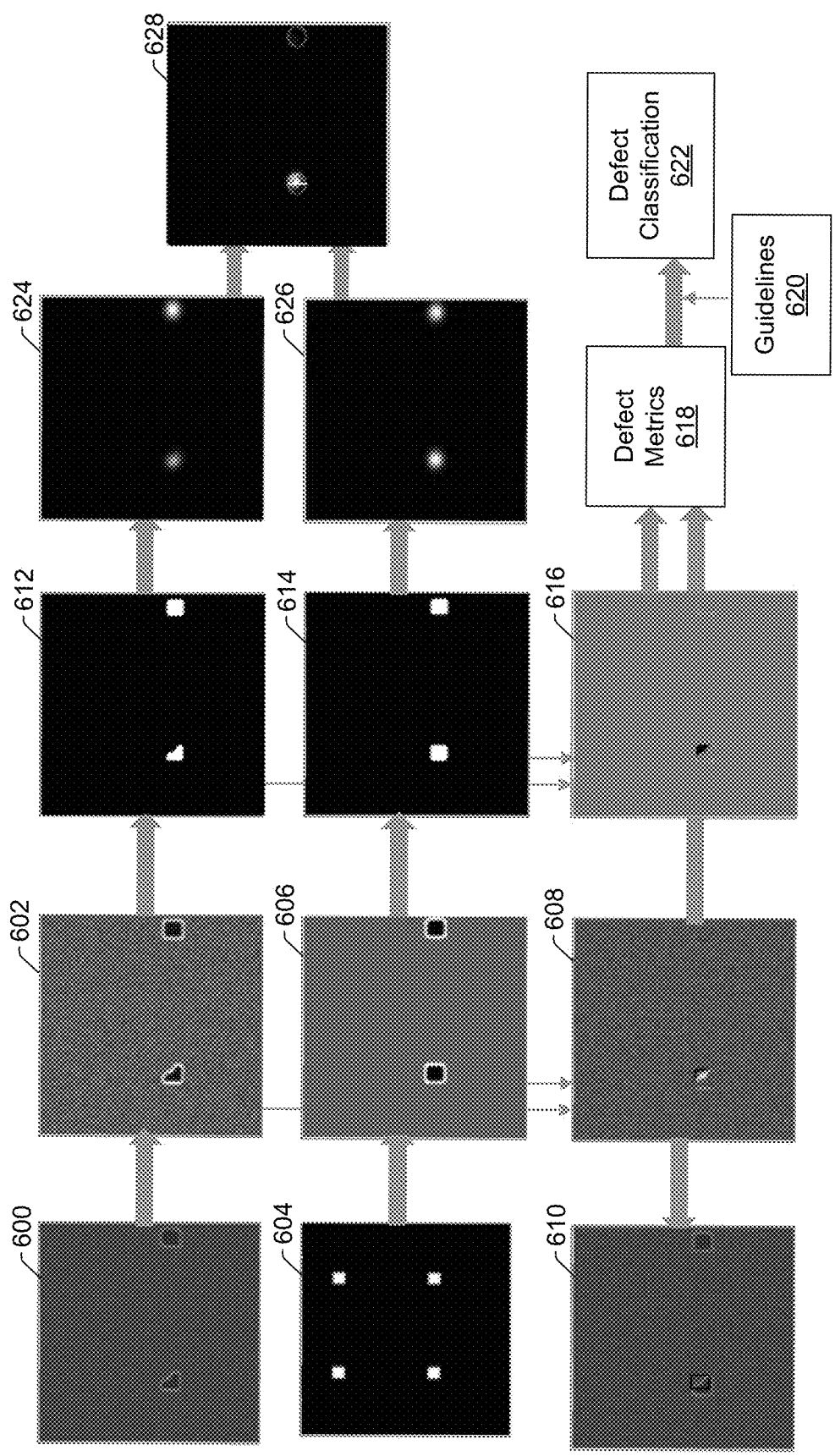
FIG. 6 is a flow chart illustrating one embodiment of steps that may be performed by the embodiments described herein for dispositioning defects detected on an EUV photomask performed using a charged particle beam subsystem.

In the example shown in FIG. 6, original charged particle beam image 600 may be demised and refined to generate de-noised test image 602. Denoising and refining of the original charged particle beam image may be performed in any suitable manner known in the art. Then, the post-OPC design database at the same location as the detected defect is clipped (i.e., extracted), and a charged particle beam model is applied to render a defect-free reference charged particle beam image. The charged particle beam model may include any appropriate charged particle beam model known in the art. In the example shown in FIG. 6, design data clip 604 (e.g., a GDS data portion) is generated using a lookup function in the design data (lookup may be performed using the test charged particle beam image), and a charged particle beam model is applied to the design data clip to generate defect-free reference charged particle beam image 606. The rendering may be calibrated using actual defect free charged particle beam images and their corresponding design data clips. The rendered defect-free charged particle beam image may be a gray scale image. The de-noised test and rendered reference charged particle beam images are aligned and then subtracted to generate a grayscale difference image that is then used to isolate the defect site by local gray level variation. Alignment and subtraction may be performed in any suitable manner known in the art. As shown in FIG. 6, reference image 606 may be subtracted from de-noised test image 602 to generate difference gray scale image 608. The defect isolation may be performed as described further herein using difference image 608 to generate defect position image 610.

In the second phase, binary contours may be extracted from the de-noised charged particle beam test image to generate the test binary image containing the detected defect and also from the rendered charged particle beam image to generate the reference binary image. Contour extraction may be applied to both the test and rendered charged particle beam images in any suitable manner known in the art. As shown in FIG. 6, binary contours may be extracted from de-noised test image 602 thereby generating test binary image 612, and binary contours may be extracted from defect-free reference charged particle beam image 606 thereby generating reference binary image 614. A binary difference image may then be generated by subtracting the reference binary image from the test binary image. For example, as shown in FIG. 6, reference binary image 614 may be subtracted from test binary image 612 thereby generating binary difference image 616.

The gray and binary difference images thus generated may then be used to calculate defect metrics from the defect isolated in the first phase and to effectively determine the type of defect, e.g., line edge roughness (LER), PinHole, PinDot, Intrusion, Extrusion, etc. For example, as shown in FIG. 6, difference image 608 and binary difference image 616 may be used to calculate defect metrics 618. The defect metrics may be organized in a data structure such as a defect information table and may include information such as defect area in the binary difference image, size in the x and y directions in the binary difference image, defect area in the gray scale difference image, and size in the x and y directions in the gray scale difference image. The defect metrics may be used with or input to guidelines 620 that define different defect types to generate defect classifications 622. The defect metrics may otherwise be determined from the gray scale difference image and the binary difference image in any suitable manner known in the art. Defect classification may also be performed as described further herein.

In the third phase, an appropriate mask model may be applied to both the test and reference binary images with the associated scanner exposure conditions to generate test and reference EUV aerial images. The mask model may be applied to the images as described further herein. In this manner, the computer subsystem(s) may run printability simulations with scanner optical conditions. For example, as shown in FIG. 6, test binary image 612 may be input to an EUV lithography simulation to generate test aerial image 624, and reference binary image 614 may be input to the EUV lithography simulation to generate reference aerial image 626. The Aerial Image Analyzer (AIA) may then be run to compute printability of all features within the field of view (FOV) of the charged particle beam subsystem in which the defect is located. For example, as shown in FIG. 6, test aerial image 624 and reference aerial image 626 may be input to AIA that may generate simulated image 628 showing how the defect would affect the features of the mask in the aerial image projected on a wafer during a lithography process. Examples of the AIA that may be used in the embodiments described herein are described in "Printability and actinic AIMS review of programmed mask blank defects," by Verduijn et al., SPIE Proceedings Vol. 10143, Extreme Ultraviolet (EUV) Lithography VIII, 101430K, Mar. 24, 2017, 13 pages, which is incorporated by reference as if fully set forth herein. The embodiments described herein may be further configured as described in this publication.

In some embodiments, the charged particle beam subsystem is configured for automated generation of the charged particle beam images at all of the locations of the detected defects, dispositioning the detected defects includes determining if the detected defects are real defects or false defects, and the one or more computer subsystems are configured for automated dispositioning of all of the detected defects determined to be the real defects. For example, the charged particle beam subsystem may be configured to automatically generate charged particle beam images for each of the detected defects reported by the inspection. In particular, a recipe (i.e., a set of instructions) used to generate the charged particle beam images may instruct the charged particle beam subsystem to generate charged particle beam images at each of the locations of the detected defects determined by the computer subsystem(s) thereby enabling automatic generation of the charged particle beam images for all of the detected defects. In addition, the computer subsystem(s) may be configured to automatically process each of the charged particle beam images generated for the detected defects to disposition the detected defects automatically, which may include determining if the detected defects are real or false defects, possibly in combination with any other dispositioning described herein. Once the computer subsystem(s) determine which of the detected defects are real or false, any further dispositioning may only be performed for the real defects thereby making the dispositioning more efficient.

In a further embodiment, dispositioning the detected defects includes determining isolation of the detected defects with respect to patterned features in a FOV of the charged particle beam subsystem centered on the locations of the detected defects (or in which the locations of the detected defects are positioned). Defect isolation identifies the detected defect location within the FOV of the charged particle beam image. For example, the detected defect location may be determined using local gray level variation and a difference image generated from the charged particle beam image acquired at the defect location. In one such example, the local gray level variation may be determined as a function of position within the difference image, and the maximum value of the local gray level variation may be determined as the defect location. Determining the location of the defect within the FOV of the charged particle beam image may, however, be performed in any other suitable manner known in the art.

Determining the defect isolation may also include determining which of the patterned features of the photomask in the FOV of the charged particle beam image that a detected defect is closest to and how close the detected defect is to those patterned features. For example, once the location of a detected defect within the FOV of the charged particle beam image has been determined as described above, that defect location information can be used to identify spatial information for the detected defect relative to patterned features on the photomask using the test image for the detected defect. Determining the defect isolation may include identifying which of the patterned features that a detected defect overlaps with, which may be the case if the defect is located within or at least partially overlaps with one or more patterned features, or which of the patterned features is defective. Defect isolation may also include determining the location of a detected defect with respect to the patterned features in the FOV (regardless of whether or not the detected defect overlaps with or is within a patterned feature itself). For example, if a detected defect is (at least partially) spatially coincident with a patterned feature, determining the defect isolation may include determining the location of the detected defect with respect to the perimeter or outer boundary of the patterned feature. If a detected defect is not spatially coincident with a patterned feature in the FOV of the charged particle beam subsystem, determining the defect isolation may include identifying the patterned feature that the defect is closest to and then determining how close the defect is to the patterned feature. The defect isolation may also include determining how close (in some length dimensions) that a detected defect is to a particular part of a patterned feature (e.g., a corner, a side, an end, etc.). The space between the detected defect and the patterned feature that it is closest to may be expressed as a single value, a range of values, an average, a function, or in any other suitable manner. In addition, a user may particularly care about how close a detected defect is to a subset of the patterned features of the photomask than other patterned features of the photomask. For example, one or more parameters of the defect isolation step may be set such that the detected defect location relative to its closest patterned feature is determined and/or the detected defect location relative to any one type of patterned feature is determined if that one type of patterned feature is within the FOV of the charged particle beam subsystem. The relative location of a detected defect to a patterned feature that may not be closest to the defect may otherwise be determined as described herein.

In one such embodiment, the computer subsystem(s) are configured for sending the determined isolation of the detected defects to a photomask repair tool, and the photomask repair tool uses the determined isolation of the detected defects in a repair process performed on the photomask. In this manner, the defect isolation information can be used in the repair tool when the mask needs to be fixed. In one such example, as shown in FIG. 1, computer subsystem 118 (or any other computer subsystem of the system) may be configured to send the determined isolation of the detected defects to photomask repair tool 140, which may or may not be part of the system. The photomask repair tool may have any suitable configuration known in the art. In addition, the photomask repair tool may be a commercially available photomask repair tool such as the MeRiT neXT system that is commercially available from Carl Zeiss SBE, LLC, Thornwood, N.Y. The photomask repair tool may use the determined isolation to determine one or more parameters of the repair process such as repair position and area with the aim of repairing the detected defects without altering any correctly formed features proximate the detected defects.

Figure 4:
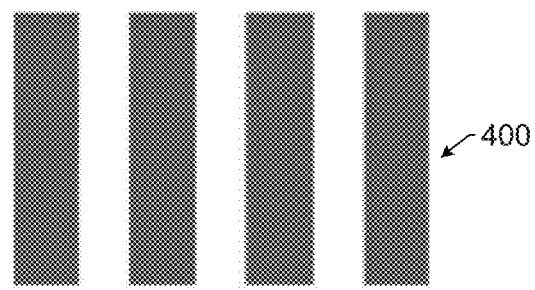
FIG. 4 is a schematic diagram illustrating a plan view of one example of a portion of an EUV photomask pattern without any defects.
Figure 5:
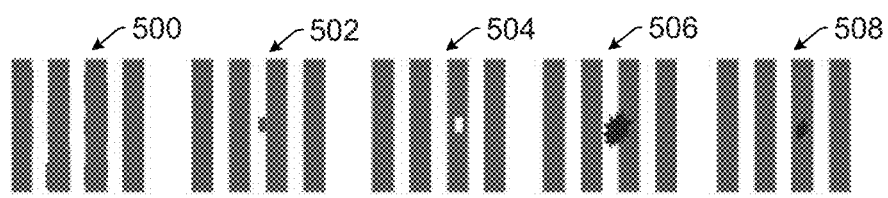
FIG. 5 is a schematic diagram illustrating a plan view of the portion of the EUV photomask pattern of FIG. 4 with various examples of defects that may be detected therein.

In another embodiment, dispositioning the detected defects includes classifying the detected defects based on the charged particle beam images generated for the detected defects by identifying a type of the detected defects. Classification defines the type of defect. FIG. 4 shows one example of a defect free mask pattern 400, where color areas indicate absorber and non-color areas indicates ML. FIG. 5 shows some examples of different types of defects. If there is no significant defect and only local line edge roughness (LER) contributes to the detected inspection signal or image, the detected defect is called LER as shown by defect example 500. If a defect, like a protrusion or intrusion, is connected to an absorber, the detected detect is called a hard-defect as shown by defect example 502. If the absorber has a pin-hole and the bottom ML is exposed by the pin-hole, the detected defect is a pin-hole defect as shown by defect example 504. If a portion of a particle or a whole particle is located on the ML, the particle or particle portion has a printability impact on wafer exposure and is classified as a particle-on-ML as shown by defect example 506. If a particle is completely on the absorber, the particle does not have any printability impact on the wafer exposure and goes to a different bin, which is particle-on-absorber as shown by defect example 508.

Classifying the detected defects based on the charged particle beam images generated for the detected defects may be performed in any suitable manner. For example, the computer subsystem(s) may determine one or more characteristics of the detected defects based on the charged particle beam images. Those characteristic(s) may include, for example, size, shape, orientation, location, location relative to any nearby patterned features, texture, and the like. Any determined characteristic(s) and possibly the charged particle beam images may be input to a defect classifier by the computer subsystem(s). The defect classifier may be configured for determining the class (or type, bin, etc.) of the detected defects based on their determined characteristic(s) and/or charged particle beam images. The defect classifier may be any suitable defect classification method or algorithm known in the art. One example of such a detect classifier is a relatively simple decision tree in which different types of defects are separated by applying different cutlines to the defect characteristic(s) that separate different types of defects from each other. Other examples of suitable defect classifiers are machine learning type defect classifiers, some examples of which are described in U.S. Patent Application Publication Nos. 2018/0107928 published Apr. 19, 2018 by Zhang et al. and 2019/0073568 published Mar. 7, 2019 by He et al., which are incorporated by reference as if fully set forth herein. The embodiments described herein may be further configured as described in these publications.

Figure 7:
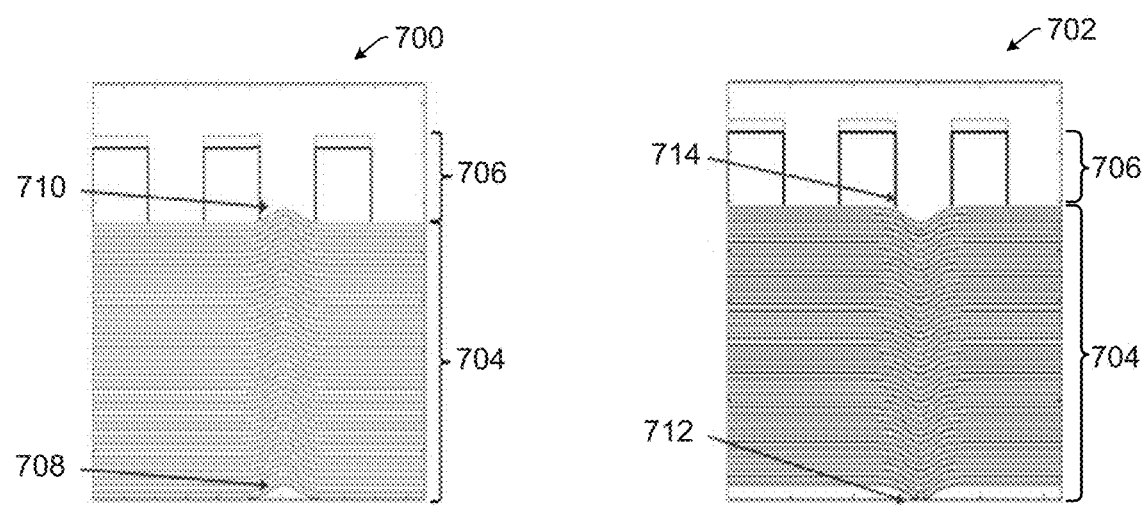
FIG. 7 is a schematic diagram illustrating a side view of one example of a portion of an EUV photomask with different examples of buried defects formed thereon.

In a further embodiment, the system includes an atomic force microscopy (AFM) subsystem configured for scanning the photomask at the locations of the detected defects thereby generating height information for the locations of the detected defects. For example, in addition to absorber-related defects, the embodiments described herein can be used for buried defects in ML, where the defect is mostly located on the bottom of the ML stack but that morphology is transferred from the bottom to the surface, e.g., as shown in FIG. 7. FIG. 7 shows examples of typical ML buried defects on an EUV photomask. Diagram 700 shows a bump type defect, and diagram 702 shows a pit type defect. As shown in diagrams 700 and 702, the EUV photomask includes ML stack 704 and patterned absorber stack 706. In some instances, ML bump defect 708 on the bottom of the ML stack may be transferred to the uppermost surface of the ML stack as ML bump defect 710 on the surface. In addition, ML pit defect 712 on the bottom of the ML stack may be transferred to the uppermost surface of the ML stack as ML pit defect 714 on the surface. The nature of the defects comes from the bottom of the ML, and they can transfer the morphology up to the uppermost surface of the ML. Such defects may therefore induce printable detects on wafers due to the phase differences they can cause in the light that is projected onto the wafers. An AFM tool can therefore be used to scan the surface of the EUV photomask to obtain height information as an image (i.e., height information as a function of x and y position across the EUV photomask), which can be used to disposition the defects.

As shown in FIG. 1, the system may include AFM subsystem 136 that is coupled to computer subsystem 138. Computer subsystem 138 may be coupled to other computer subsystem(s) of the system as described further herein such that information, data, etc. can be transmitted between the computer subsystem(s). The AFM subsystem may have any suitable configuration known in the art. For example, suitable AFM tools that can be used as the AFM subsystem described herein are commercially available from Bruker Corp., Billerica, Mass. (such as the InSight family of products) and in photomask repair tools such as the rapid probe microscope (RPM) in the MeRiT neXT system that is commercially available from Zeiss. The AFM subsystem may also not be part of the system, but may be coupled to the system in some manner (e.g., by their computer subsystem(s)).

In some such embodiments, the computer subsystem(s) may be configured to send results of the defect detection to the AFM subsystem (e.g., as an inspection results file), and the AFM subsystem may generate height information for all of the detected detects automatically. In another embodiment, the computer subsystem(s) may identify one or more of the detected defects as described further herein and select the identified one or more detected defects for scanning by the AFM subsystem. If fewer than all of the detected defects are selected for AFM scanning, only the defect detection results for the selected defects may be sent to the AFM subsystem or a computer subsystem coupled thereto. Regardless of how many detected defects are selected or sent for AFM scanning, the AFM subsystem may be configured for automatic scanning of the detected defects, and the scanning may be automated as described further herein. Parameters of the AFM scanning that are used for the detected defects may all be the same (some predetermined best known AFM parameters) or may be selected dynamically based on any information generated for the detected defects prior to or during AFM scanning.

In one such embodiment, the computer subsystem(s) are configured for identifying one or more of the detected defects that do not appear in the charged particle beam images generated at the locations of the one or more of the detected defects, and the AFM subsystem is configured for automated scanning of the photomask at only the locations of the identified one or more of the detected defects. For example, if there is a significant defect signal detected by photomask inspection, but no defect is observed in the charged particle beam images (which may particularly be the case when a defect is detected on the non-absorber covered portion of the photomask and is therefore not an absorber related defect), the AFM subsystem can be used to scan the surface at the location of the non-redetected defect to obtain height information as an image that can be used for dispositioning the detected defect. In particular, if a defect location reported by inspection is scanned by the charged particle beam subsystem as described herein and no defect can be found in the charged particle beam image(s) generated for that defect location (which can be determined by performing any suitable defect location method on the charged particle beam image(s)), then that defect location may be selected for AFM subsystem scanning. The defect re-detection performed using the charged particle beam images may be performed as described further herein with respect to inspection or in any other suitable manner known in the art. Since the AFM subsystem can generate height information for the detected defects, the information generated by the AFM subsystem may be more suitable for defect dispositioning than the available inspection images (or information determined therefrom) and the available charged particle beam images in which no defect was re-detected.

In another such embodiment, the computer subsystem(s) are configured for acquiring information for additional defects detected on a blank substrate prior to fabrication of the photomask with the blank substrate, and the AFM subsystem is configured for scanning the photomask at locations of the additional defects thereby generating height information for the locations of the additional defects. For example, prior to forming the photomask pattern, a blank substrate (e.g., a substrate consisting of the ML stack shown in FIG. 3 for example and not the patterned absorber) may be inspected. If the blank substrate passes inspection (e.g., is determined to be sufficiently defect free), the patterned absorber layer may be formed on the blank substrate thereby forming a photomask. That photomask can then be inspected as described herein. If actinic blank inspection of the photomask noticed the location of ML defects prior to absorber patterning, the AFM tool can be used to scan the surface to obtain height information that is then used as the images for dispositioning the detected defects performed as described herein.

The computer subsystem(s) can acquire the information for the additional defects detected by blank substrate inspection in any suitable manner (e.g., from the inspection system (not shown) that performed the blank substrate inspection or from a storage medium, e.g., storage media 120 shown in FIG. 1, in which the blank substrate inspection results are stored). The information for the additional defects may include any and/or all of the information for the additional defects reported by blank substrate inspection, which will include information for the blank substrate defects that can be used by the computer subsystem(s) described herein to determine the locations on the photomask at which AFM scanning will be performed to generate height information for those blank substrate defects. The AFM subsystem may scan the photomask at the locations of the additional defects as described further herein.

In some such embodiments, the computer subsystem(s) are configured for dispositioning the detected defects based on the height information generated for the detected defects. Dispositioning the detected defects based on the height information may be performed in any suitable manner. For example, the height information may be input to a defect classifier as described further herein, and the defect classifier may determine a defect type based on the height information. In one such example, if the height information shows that a detected defect protrudes above the upper surface of the ML stack of the photomask, the defect classifier may determine that the defect is an ML bump defect such as that shown in FIG. 7. On the contrary, if the height information indicates that a detected defect intrudes into the surface of the ML stack of the photomask, the defect dispositioning may determine that the defect is an ML pit defect such as that shown in FIG. 7. Dispositioning the detected defects based on the height information may also or alternatively include any of the other dispositioning described herein as performed using the charged particle beam images.

In one such embodiment, dispositioning the detected defects based on the height information includes determining printability of the detected defects on a wafer if the wafer is printed with the photomask in a lithography process, and determining the printability includes inputting design information for the photomask into a model of the AFM subsystem thereby generating simulated reference height information for a defect free version of the photomask, simulating aerial images for the height information generated for the detected defects and for the simulated reference height information, and determining how the detected defects affect one or more patterns printed on the wafer in the lithography process based on the simulated aerial images.

Figure 8:
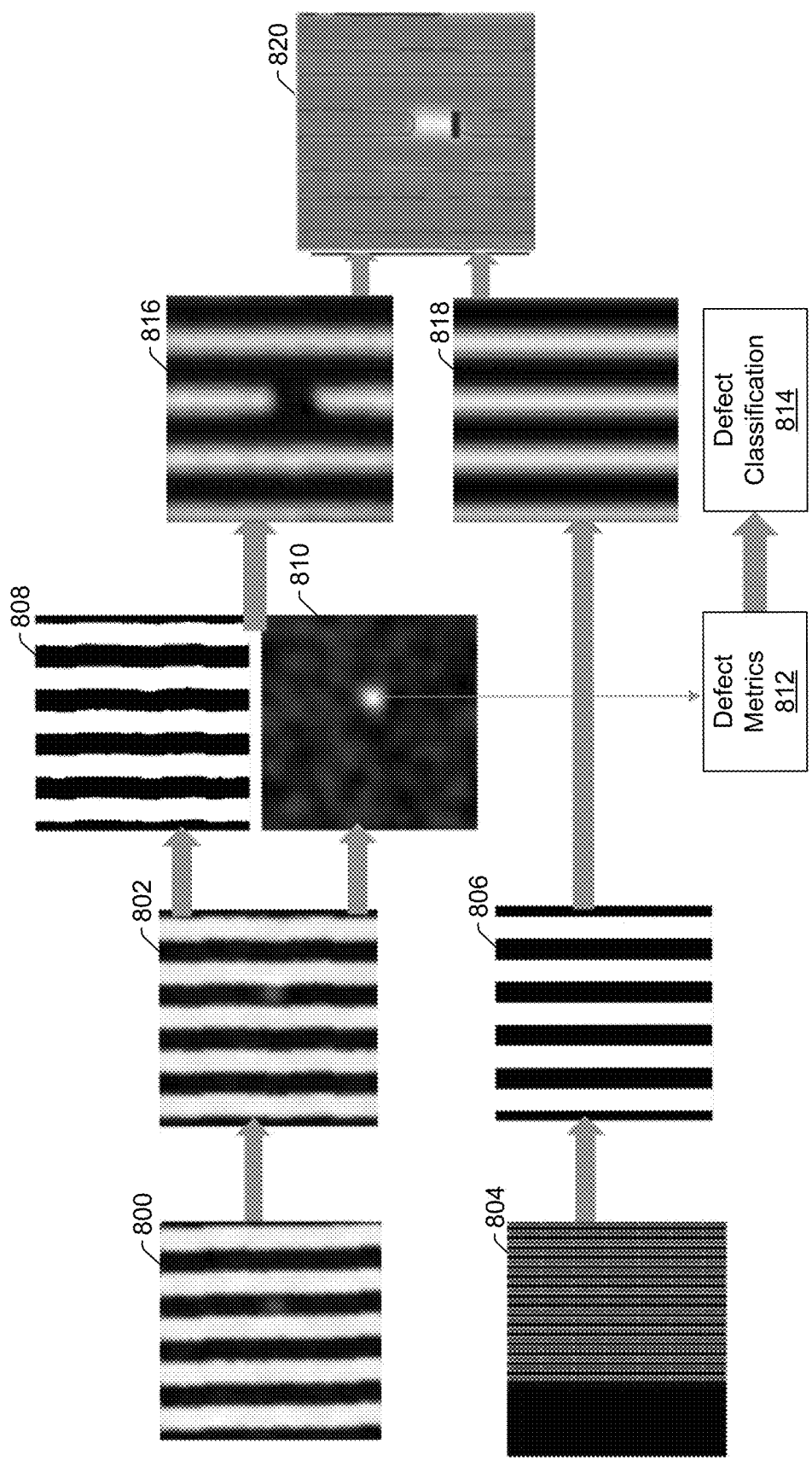
FIG. 8 is a flow chart illustrating one embodiment of steps that may be performed by the embodiments described herein for dispositioning defects detected on an EUV photomask performed using an atomic force microscopy subsystem.

In this embodiment, a defect-free mask may be rendered from the corresponding post-OPC design database clips in a die-to-database type approach. The AFM-based workflow then involves three main phases, as shown in FIG. 8. In the first phase, the original images from the AFM tool may first be de-noised and refined to improve the quality of the images. For example, as shown in FIG. 8, test AFM image 800 may be de-noised, corrected for tilt, and refined to generate refined test image 802. Denoising and refining the original AFM images may be performed in any suitable manner known in the art. In addition, a portion of the post-OPC design database at the same location as the defect is clipped (extracted), and an AFM model is applied to render a defect-free reference AFM image. For example, the refined test image may be used with a lookup function to search the design database clip for the photomask to find the corresponding design clip shown in FIG. 8 as design clip 804. An AFM model may then be applied to the design clip to generate a defect-free reference AFM image shown in FIG. 8 as reference AFM image 806. The AFM model may be calibrated using known defect free AFM test images and their corresponding design clips. The AFM model may include any suitable AFM model known in the art. The de-noised test and rendered reference AFM images may be aligned, corrected for tilt, and subtracted to generate a grayscale difference image, which is then used to isolate the defect site by local height information. The alignment, tilt correction, and subtraction of the test and reference AFM images may be performed in any suitable manner known in the art. The defect site may be isolated by local height information in the AFM difference image in any suitable manner known in the art.

In the second phase, binary contours and ML morphologies may be extracted from the de-noised AFM test image to generate both a test binary image and test ML morphology containing the detected defect and also from the rendered AFM image to generate a reference binary mask and flat. ML morphology. For example, as shown in FIG. 8, de-noised AFM test image 802 may be processed to extract the absorber contours thereby generating binary contour image 808. The de-noised AFM test image may also be processed for extraction of the ML morphology thereby generating test ML morphology image 810. The binary contours and ML morphologies may be extracted in any suitable manner known in the art. The test ML morphology image may be used to calculate defect metrics from the defect isolated in the first step, and the defect metrics may include, for example, defect area, size, height, percentage of defect lying on the etc. For example, as shown in FIG. 8, test ML morphology image 810 may be used to determine defect metrics 812, which may be stored in a defect information table or any other suitable data structure. The defect information that is determined and stored may include any suitable information that can be determined from the extracted ML morphology image such as ML height. The defect information may be extracted from the test ML morphology image in any suitable manner known in the art. This information can then be used to determine the exact type of defect, for example, pit, bump, etc. For example, as shown in FIG. 8, defect metrics 812 may be input to defect classification 814, which determines the type of defects from the information in the defect metrics. Defect classification 814 may be performed as described further herein (e.g., using a defect classifiers or in any other suitable manner known in the art.

In the third phase, the DPS mask model is applied to both the test and reference AFM images with the associated scanner exposure conditions to generate test and reference EUV aerial images. This step may be performed as described further herein. In addition, this simulation may include rigorous FDTD solver and RCWA. For example, as shown in FIG. 8, binary contour image 808 and test ML morphology image 810 may be input to an EUV simulation model to generate test aerial image 816. In addition, reference AFM image 806 may be input to the EUV simulation model to generate reference aerial image 818. Here, conformal ML deposition is assumed, where measured surface morphology by AFM is the same through the entire ML stack (e.g., 40 pairs of ML stack) down to the bottom. The reference aerial image may be subtracted from the test aerial image to generate difference aerial image 820, which can then be used for printability analysis. The AIA is then run to compute printability of all features within the FOV.

In a further such embodiment, the computer subsystem(s) are configured for automated dispositioning the detected defects based on the height information generated for the detected defects. For example, any or all of the dispositioning described herein may be performed automatically by the computer subsystem(s). In other words, once the AFM subsystem has generated height information for a detected defect, the computer subsystem(s) may automatically perform defect dispositioning using the height information and any other information for the detected defect generated by the system or otherwise made available to the system. Enabling the automatic dispositioning, which is provided by the embodiments described herein, is advantageous as described further herein.

In another embodiment, the one or more computer subsystems are configured for dispositioning the detected defects based on the charged particle beam images generated for the detected defects in combination with images generated from the energy from the photomask detected by the inspection subsystem. The images may be generated as described further herein. In one such embodiment, the energy directed to the photomask by the inspection subsystem includes light having a wavelength of 193 nm. For example, inspection of the photomask may be performed with 193 nm light thereby making 193 nm images of the photomask readily available for defect dispositioning. In particular, the computer subsystem(s) may store the output of the inspection subsystem for any defects detected on the photomask and then may use the stored output for dispositioning the defects in combination with the charged particle images. Using such images in conjunction with charged particle images may be particularly advantageous for relatively shallow, multilayer defects that do not have any signal in the charged particle beam images. For example, as described further herein, if a defect is below the uppermost surface of the photomask, the defect may not generate a signal in the charged particle beam images. Reviewing optical 193 nm images together with the charged particle beam images to thereby disposition the defects may also be particularly advantageous if the high resolution AFM is not fast or stable enough for some applications. The computer subsystem(s) may also use the charged particle beam images in combination with any other inspection images not just 193 nm images) and/or other optical images that are available for the defects detected on the photomask. The defect dispositioning performed using charged particle beam in combination with other images may otherwise be performed as described further herein.

The computer subsystem(s) may also be configured for defect dispositioning using other combinations of images and information generated or acquired by the systems described herein. For example, height information for the defects determined using the AFM subsystem may be used in combination with optical images for the defects. In one such embodiment, the one or more computer subsystems are configured for dispositioning the detected defects based on the height information generated for the detected defects in combination with images generated from the energy from the photomask detected by the inspection subsystem. The images may include any of the images described herein. In one such example, the images may be 193 nm optical images. For example, in one embodiment, the energy directed to the photomask by the inspection subsystem includes light having a wavelength of 193 nm. However, the optical images used with the height information for defect dispositioning may also include any other optical images described above. The defect dispositioning performed using the optical images and the height information may otherwise be performed as described further herein.

Each of the embodiments of each of the systems described above may be combined together into one single embodiment.

The embodiments described herein have a number of advantages over other methods and systems for EUV photomask inspection. For example, one advantage of the embodiments described herein is that they are able to isolate the exact defect location by comparing the secondary images the charged particle beam images and/or the AFM images) to the design database. Another advantage is that the embodiments enable the defect type classification by substantially high resolution charged particle beam/AFM images. An additional advantage is that printability can be predicted without relying on any operator's experience or actinic imaging tool. Moreover, since the whole work flow can be fully automated by software and processed in parallel by a computing server, the throughput of the entire dispositioning can be much faster than manual dispositioning.

To the knowledge of the inventors, the embodiments described herein result from the first attempt of implementing a fusion of substantially high sensitivity EUV mask inspection followed by dispositioning capability via fully automated charged particle beam/AFM image analysis, which advantageously extends EUV photomask inspection capability and improves defect dispositioning accuracy and throughput of patterned EUV mask inspection. Unlike the embodiments described herein, an actinic imaging tool such as an AIMS tool commercially available from Zeiss can be used for EUV photomask defect dispositioning, but it is too slow to get through hundreds to thousands of defects in a production line. Another alternative to the embodiments described herein might be defect dispositioning with an actinic inspection tool with low numerical aperture (NA) inspection (LNI), but such an inspection tool is not currently available.

The embodiments described herein are also different than wafer inspection methods and systems in a number of ways. For example, for photomasks, generally, it is desirable to perform inspection at the actinic wavelength of the photomasks for several reasons including that the printability of the detected defects can be assessed with a properly configured inspection tool and the use of the actinic wavelength ensures that defects can be detected on the photomasks with sufficient sensitivity. In contrast, wafer inspection methods and systems are often designed based primarily on the smallest size of the defects that need to be detected on the wafer. Such wafer inspection does not, however, need to be performed to determine the printability of any defects on the wafers since the defects are already printed on the wafers and the wafers are not used to print any other substrates. In contrast, even if a photomask defect is imaged by a high resolution tool, there can still be some question of whether or not the defect will print on a wafer. To solve his problem, an actinic review tool captures images by scanner optics (which is low resolution) to mimic the wafer impact. The embodiments described herein replace the actinic review process by simulation, which is not necessary for wafer inspection and wafer defect analysis. In this manner, the actinic wavelength of a photomask and a wafer printed with the photomask may be the same (i.e., the wavelength of light that is used to transfer a pattern from the photomask to the wafer thereby causing a photochemical reaction in one or more materials on the wafer, e.g., a photoresist), but wafer inspection processes are not designed based on that actinic wavelength or any lack of a wafer inspection tool that is capable of inspection at that actinic wavelength.

Unlike wafer inspection, therefore, the embodiments described herein have been designed to overcome the lack of a suitable inspection method or system for EUV photomasks. The features of the embodiments described herein that enable the inspection of EUV photomasks include that the enormous number of defects detected by inspection of EUV photomasks can be dealt with efficiently by using the charged particle beam images (and optionally the AFM images) for defect dispositioning. This feature enables using a hot threshold in the inspection that results in detection of both real and false defects in great numbers without significantly impacting the inspection process. Therefore, the inspection can detect the smallest size defects that are required to be detected for RN photomask inspection, and the resulting detected false defects can be separated from the real defects by the dispositioning described herein. In addition, since the defect dispositioning (and any image generation performed to facilitate the defect dispositioning) can be automated, the embodiments described herein will be efficient, easy to use, and accurate, especially compared to other available options for EUV photomask inspection.

Another embodiment relates to a method for inspection of a photomask. The method includes directing energy to a photomask and detecting energy from the photomask. The photomask is configured as described herein. The method also includes detecting defects on the photomask based on the detected energy and generating charged particle beam images of the photomask at locations of the detected defects. The method further includes dispositioning the detected defects based on the charged particle beam images generated for the detected defects.

Each of the steps of the method may be performed as described further herein. The method may also include any other step(s) that can be performed by the inspection subsystem, charged particle beam subsystem, AFM subsystem, and/or computer subsystem(s) or system(s) described herein, which may be configured according to any of the embodiments described herein. In addition, the method described above may be performed by any of the system embodiments described herein.

Figure 9:
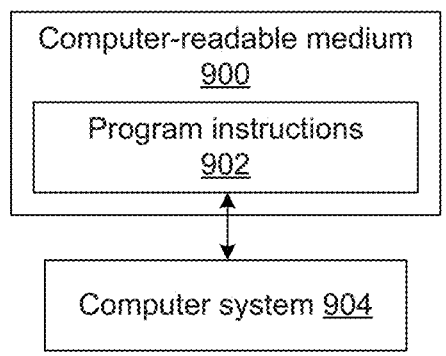
FIG. 9 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for inspecting a photomask. One such embodiment is shown in FIG. 9. In particular, as shown in FIG. 9, non-transitory computer-readable medium 900 includes program instructions 902 executable on computer system 904. The computer-implemented method may include any step(s) of any method(s) described herein.

Program instructions 902 implementing methods such as those described herein may be stored on computer-readable medium 900. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 904 may be configured according to any of the embodiments described herein.

Further modifications and alternative embodiments of various aspects of the invention will be apparent to those skilled in the art in view of this description. For example, methods and systems for dispositioning defects detected on a photomask are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A photomask inspection system, comprising:
an inspection subsystem configured for directing energy to a photomask, detecting energy from the photomask, and generating output responsive to the energy from the photomask, wherein the photomask is configured for use at one or more extreme ultraviolet wavelengths of light;
one or more computer subsystems configured for detecting defects on the photomask by applying a hot threshold to the output; and
a charged particle beam subsystem configured for generating charged particle beam images of the photomask at locations of the detected defects determined by the one or more computer subsystems, wherein the one or more computer subsystems are further configured for dispositioning the detected defects based on the charged particle beam images generated for the detected defects.

2. The system of claim 1, wherein the energy directed to the photomask by the inspection subsystem comprises light having a wavelength of 193 nm.

3. The system of claim 1, wherein the energy directed to the photomask by the inspection subsystem comprises light having one or more wavelengths in a range from 193 nm to 257 nm.

4. The system of claim 1, wherein the energy directed to the photomask by the inspection subsystem comprises light having a wavelength of 13.5 nm.

5. The system of claim 1, wherein the energy directed to the photomask by the inspection subsystem comprises electrons.

6. The system of claim 1, wherein the energy directed to the photomask by the inspection subsystem comprises ions.

7. The system of claim 1, wherein dispositioning the detected defects comprises determining if the detected defects are real defects or false defects.

8. The system of claim 1, wherein dispositioning the detected defects comprises determining if the detected defects are real defects or false defects and determining a printability of the real defects on a wafer if the wafer is printed with the photomask in a lithography process.

9. The system of claim 8, wherein determining the printability comprises inputting the charged particle beam images generated for the real defects into a model of the lithography process thereby generating simulated wafer images illustrating how the real defects affect one or more patterns printed on the wafer in the lithography process.

10. The system of claim 1, wherein dispositioning the detected defects comprises determining a printability of the detected defects on a wafer if the wafer is printed with the photomask in a lithography process, and wherein determining the printability comprises inputting design information for the photomask into a model of the charged particle beam subsystem thereby generating simulated charged particle beam reference images of a defect free version of the photomask, simulating aerial images for the charged particle beam images generated for the detected defects and for the simulated charged particle beam reference images, and determining how the detected defects affect one or more patterns printed on the wafer in the lithography process based on the simulated aerial images.

11. The system of claim 1, wherein the charged particle beam subsystem is further configured for automated generation of the charged particle beam images at all of the locations of the detected defects, wherein dispositioning the detected defects comprises determining if the detected defects are real defects or false defects, and wherein the one or more computer subsystems are further configured for automated dispositioning of all of the detected defects determined to be the real defects.

12. The system of claim 1, wherein dispositioning the detected defects comprises determining isolation of the detected defects with respect to patterned features in a field of view of the charged particle beam subsystem centered on the locations of the detected defects.

13. The system of claim 12, wherein the one or more computer subsystems are further configured for sending the determined isolation of the detected defects to a photomask repair tool, and wherein the photomask repair tool uses the determined isolation of the detected defects in a repair process performed on the photomask.

14. The system of claim 1, wherein dispositioning the detected defects comprises classifying the detected defects based on the charged particle beam images generated for the detected defects by identifying a type of the detected defects.

15. The system of claim 1, further comprising an atomic force microscopy subsystem configured for scanning the photomask at the locations of the detected defects thereby generating height information for the locations of the detected defects.

16. The system of claim 15, wherein the one or more computer subsystems are further configured for identifying one or more of the detected defects that do not appear in the charged particle beam images generated at the locations of the one or more of the detected defects, and wherein the atomic force microscopy subsystem is further configured for automated scanning of the photomask at only the locations of the identified one or more of the detected defects.

17. The system of claim 15, wherein the one or more computer subsystems are further configured for acquiring information for additional defects detected on a blank substrate prior to fabrication of the photomask with the blank substrate, and wherein the atomic force microscopy subsystem is further configured for scanning the photomask at locations of the additional defects thereby generating height information for the locations of the additional defects.

18. The system of claim 15, wherein the one or more computer subsystems are further configured for dispositioning the detected defects based on the height information generated for the detected defects.

19. The system of claim 18, wherein dispositioning the detected defects based on the height information comprises determining printability of the detected defects on a wafer if the wafer is printed with the photomask in a lithography process, and wherein determining the printability comprises inputting design information for the photomask into a model of the atomic force microscopy subsystem thereby generating simulated reference height information for a defect free version of the photomask, simulating aerial images for the height information generated for the detected defects and for the simulated reference height information, and determining how the detected defects affect one or more patterns printed on the wafer in the lithography process based on the simulated aerial images.

20. The system of claim 18, wherein the one or more computer subsystems are further configured for dispositioning the detected defects based on the height information generated for the detected defects in combination with images generated from the energy from the photomask detected by the inspection subsystem.

21. The system of claim 20, wherein the energy directed to the photomask by the inspection subsystem comprises light having a wavelength of 193 nm.

22. The system of claim 15, wherein the one or more computer subsystems are further configured for automated dispositioning the detected defects based on the height information generated for the detected defects.

23. The system of claim 1, wherein the one or more computer subsystems are further configured for dispositioning the detected defects based on the charged particle beam images generated for the detected defects in combination with images generated from the energy from the photomask detected by the inspection subsystem.

24. The system of claim 23, wherein the energy directed to the photomask by the inspection subsystem comprises light having a wavelength of 193 nm.

25. The system of claim 1, wherein the charged particle beam subsystem is further configured as an electron beam subsystem.

26. The system of claim 1, wherein the charged particle beam subsystem is further configured as an ion beam subsystem.

27. A non-transitory computer-readable medium, storing program instructions executable on a computer system for performing a computer-implemented method for inspecting a photomask, wherein the computer-implemented method comprises:
    directing energy to a photomask, detecting energy from the photomask, and generating output responsive to the detected energy, wherein the photomask is configured for use at one or more extreme ultraviolet wavelengths of light;
    detecting defects on the photomask by applying a hot threshold to the output;
    generating charged particle beam images of the photomask at locations of the detected defects; and
    dispositioning the detected defects based on the charged particle beam images generated for the detected defects.

28. A method for inspecting a photomask, comprising:
    directing energy to a photomask, detecting energy from the photomask, and generating output responsive to the detected energy, wherein the photomask is configured for use at one or more extreme ultraviolet wavelengths of light;
    detecting defects on the photomask by applying a hot threshold to the output;
    generating charged particle beam images of the photomask at locations of the detected defects; and
    dispositioning the detected defects based on the charged particle beam images generated for the detected defects.

* * * * *